United States Patent
Kamo et al.

[11] Patent Number: 5,961,717
[45] Date of Patent: Oct. 5, 1999

[54] SYNTHESIS OF PHOSPHORUS-DOPED DIAMOND

[75] Inventors: Mutsukazu Kamo, Tsuchiura; Satoshi Koizumi, Tsukuba; Hiroyuki Ozaki, Tsuzuki-gun, all of Japan

[73] Assignee: National Institute for Research in Inorganic Materials, Tsukuba, Japan

[21] Appl. No.: 08/791,614

[22] Filed: Jan. 31, 1997

[30] Foreign Application Priority Data

Sep. 3, 1996 [JP] Japan ................................. 8-252376

[51] Int. Cl.⁶ ..................................................... C30B 25/16
[52] U.S. Cl. ............................. 117/92; 117/103; 117/929; 423/446; 427/249
[58] Field of Search ................................. 117/92, 95, 103, 117/108; 423/446; 427/249, 255.2

[56] References Cited

U.S. PATENT DOCUMENTS

| | | | |
|---|---|---|---|
| 4,806,900 | 2/1989 | Fujimori et al. | 338/22 R |
| 5,051,785 | 9/1991 | Beetz, Jr. et al. | 357/4 |
| 5,223,721 | 6/1993 | Iida et al. | 257/77 |
| 5,234,724 | 8/1993 | Schmidt | 427/530 |
| 5,368,897 | 11/1994 | Kurihara et al. | 427/450 |
| 5,400,738 | 3/1995 | Shiomi et al. | 117/84 |
| 5,463,018 | 10/1995 | Rieke | 528/373 |
| 5,474,816 | 12/1995 | Falabella | 427/580 |

FOREIGN PATENT DOCUMENTS 2 228 141  8/1990  United Kingdom.

OTHER PUBLICATIONS

Database WPI, Derwent Publications, AN–92–335378/41, JP–A–4–238 895, Aug. 26, 1992.

*Primary Examiner*—Felisa Garrett
*Attorney, Agent, or Firm*—Oblon, Spivak, McClelland, Maier & Neustadt, P.C.

[57] ABSTRACT

A synthesis of phosphorus-doped diamond by a microwave plasma method using a volatile hydrocarbon and hydrogen mixed therewith, as a reaction gas, wherein phosphorus is used as a dopant, and hydrogen bonded to the phosphorus is dissociated so that the phosphorus is introduced into diamond as an impurity without being bonded to hydrogen.

9 Claims, No Drawings

SYNTHESIS OF PHOSPHORUS-DOPED DIAMOND

The present invention relates to a synthesis of phosphorus-doped diamond. More particularly, the present invention relates to a method for introducing phosphorus into diamond as an impurity in a gas phase synthesis of diamond, as a synthesis of diamond showing n-type semiconducting characteristics.

In a synthesis of phosphorus-doped diamond by a microwave plasma assisted chemical vapor deposition (CVD) method, phosphine ($PH_3$) is introduced into a reaction gas comprising hydrogen and methane, and the phosphine is decomposed in a microwave plasma to dope phosphorus into the grown diamond.

However, by the previous method of doping phosphorus into diamond by decomposition of phosphine in a microwave plasma, the phosphorus is doped in such a state as bonded to hydrogen, whereby there has been a problem that the phosphorus can not be an electron donor.

Further, as a method for doping phosphorus into diamond, an ion implantation method is also known. However, by this method, phosphorus which has a larger mass than carbon is driven into the diamond, whereby defects are likely to be formed in the diamond, and the phosphorus will be doped at an interstitial site of the diamond lattice without being bonded to carbon. Thus, it has been difficult to form a bond in the diamond lattice.

Further, also by a chemical transportation reaction method which is a synthesis method of diamond without using a plasma, it is possible to dope phosphorus into diamond by placing red phosphorus together with graphite in a reaction system and evaporating it in the system. However, due to the difficulties to control the gas phase composition, it has been difficult to control the concentration of the phosphorus in the diamond.

The present invention has been made to solve the above problems and to provide a method whereby the phosphorus concentration in diamond can be controlled precisely in the synthesis of phosphorus-doped diamond by a microwave plasma method, and the phosphorus can be doped at a substitutional site in the diamond lattice without being bonded to hydrogen.

The present invention provides a synthesis of phosphorus-doped diamond by a microwave plasma method using a volatile hydrocarbon and hydrogen mixed therewith, as a reaction gas, wherein phosphorus is used as a dopant, and hydrogen bonded to the phosphorus is dissociated so that the phosphorus is introduced into diamond as an impurity without being bonded to hydrogen.

Namely, the present invention provides a synthesis of phosphorus-doped diamond by a microwave plasma method for synthesizing diamond by using hydrogen and a volatile hydrocarbon, as a reaction gas, wherein a phosphorus compound is added to the reaction gas, followed by excitation by a microwave plasma, so that hydrogen bonded to the phosphorus is dissociated, and a single crystal or polycrystalline thin film of diamond containing phosphorus atoms, is grown on a substrate placed in a reactor.

Now, the present invention will be described in detail with reference to the preferred embodiments.

The phosphorus compound to be used for the synthesis of the present invention may, for example, be phosphine ($PH_3$), phosphonium chloride ($PH_4Cl$) or an element such as red phosphorus (P). Among them, phosphine is preferred. The ratio of carbon (C) in the volatile hydrocarbon to the hydrogen ($H_2$) in the reaction gas is preferably 1:100 or less, more preferably from 1:1000 to 5:1000. The ratio of the phosphorus (P) to the carbon (C) in the reaction gas is preferably 4:100 or less e.g. from 4:100 to 4:10,000, more preferably 3:100 to 1:1000. The temperature of the substrate on which diamond precipitates, is usually from 900 to 1100° C., preferably from 950 to 10000° C. The pressure in the reaction system is usually from 50 to 500 Torr, preferably from 80 to 150 Torr.

To let a diamond single crystal film grow, it is preferred to use a substrate of hetero-epitaxially grown diamond or single crystal diamond. Any one of the {111} face, the {110} face and the {100} face may be used, but the {111} face is preferred.

Now, the present invention will be described in further detail with reference to Examples. However, it should be understood that the present invention is by no means restricted to such specific Examples.

The microwave plasma method used in the Examples and Comparative Examples of the present invention is the known method of U.S. Pat. No. 4,434,188 in which the formation of a plasma and the heating of the diamond substrate are carried out simultaneously by microwave irradiation in the reaction chamber as described with reference to FIG. 3 of U.S. Pat. No. 4,434,188.

EXAMPLE 1

In the microwave plasma method, a reaction gas having 0.3% of methane ($CH_4$) and 0.003% of phosphine ($PH_3$) added to hydrogen ($H_2$), was introduced into the reaction chamber to a pressure of 100 Torr, and using, as the substrate, the {111} face of single crystal diamond, this substrate was heated at 950° C. to form diamond having a thickness of 0.5 $\mu$m thereon. The formed film was analyzed by a secondary ion mass spectrometer, whereby the hydrogen concentration in the diamond was the same as the hydrogen concentration in the diamond substrate used, and no increase in the hydrogen concentration due to the addition of phosphorus was observed. Hall effect was measured, whereby this diamond film showed n-type characteristics and had a mobility of 2.8 $cm^2/V \cdot s$ and a carrier concentration of $3 \times 15^{15}/cm^3$ at a temperature of 400K.

EXAMPLE 2

In the microwave plasma method, a reaction gas having 0.15% of methane ($CH_4$) and 0.00015% of phosphine ($PH_3$) added to hydrogen ($H_2$), was introduced into the reaction chamber to a pressure of 80 Torr, and using, as the substrate, the {111} face of single crystal diamond, this substrate was heated at 900° C. to form a diamond film having a thickness of 0.5 $\mu$m thereon. The hydrogen concentration was analyzed by means of a secondary ion mass spectrometry, whereby the hydrogen concentration in the formed diamond was less than the detectable limit, and no addition of hydrogen due to the addition of phosphorus, was observed. Hall effect was measured, whereby this diamond film showed n-type characteristics and had a mobility of 26.5 $cm^2/V \cdot s$ and a carrier concentration of $1 \times 10^{14}/cm^3$ at a temperature of 400K.

EXAMPLE 3

In the microwave plasma method, a reaction gas having 0.15% of methane ($CH_4$) and 0.00015% of phosphine ($PH_3$) added to hydrogen ($H_2$), was introduced into the reaction chamber to a pressure of 80 Torr, and using, as the substrate, the {111} face of single crystal diamond and an ultrahigh pressure mercury lamp for generating ultraviolet rays (which accelerated the decomposition of the phosphine), the ultraviolet rays were irradiated to the substrate to form a diamond film having a thickness of 0.2 μm. The hydrogen concentration was analyzed by means of a secondary ion mass spectrometer, whereby the hydrogen concentration in the formed diamond was less than the detectable limit, and no addition of hydrogen due to the addition of phosphorus was observed.

EXAMPLE 4

In the microwave plasma method, phosphine ($PH_3$) was added to hydrogen ($H_2$) containing from 0.1 to 0.5% of methane ($CH_4$) so that the ratio of phosphorus (P) to carbon (C) became 4:100 or less, and the mixture was introduced into the reaction chamber to a pressure of from 50 to 300 Torr. Then, at a substrate temperature of from 900 to 1100° C., a diamond film having a thickness of 0.5 μm was formed on the {111} face of single crystal diamond. Hall effect of this film was measured, and the results are shown in Table 1.

TABLE 1

| $CH_4$ Concentration | P/C (%) | Carrier mobility ($cm^2/V \cdot s$) | Carrier concentration ($cm^{-3}$) |
| --- | --- | --- | --- |
| 0.1 | 0.02 | 54.3 | $2 \times 10^{13}$ |
| 0.1 | 0.1 | 26.5 | $1 \times 10^{14}$ |
| 0.3 | 4 | 0.2 | $1.9 \times 10^{17}$ |
| 0.3 | 0.3 | 12.5 | $1.5 \times 10^{14}$ |

Comparative Example 1

At a substrate temperature of 830° C., a phosphorus-doped diamond film having a thickness of 0.5 μ was synthesized on the (111) face of single crystal diamond under a pressure of 80 Torr under such a condition that to hydrogen ($H_2$), the methane ($CH_4$) concentration was 0.3%, and the phosphine ($PH_3$) concentration was 0.0006%, 0.0003%, 0.00015% or 0.00003%. The concentrations of phosphorus and hydrogen in each of the synthesized diamond films, were analyzed by means of a secondary ion mass spectrometry, whereby the hydrogen concentration was found to have increased in proportion to the increase of the phosphorus concentration. The electrical characteristics were measured, whereby each of the films showed a high resistivity of at least $10^8$ Ω·cm.

Comparative Example 2

At a substrate temperature of 1200° C., a synthesis of phosphorus-doped diamond film was attempted on the (111) face of single crystal diamond under a pressure of 80 Torr under such a condition that to hydrogen ($H_2$), the methane ($CH_4$) concentration was 0.1%, and the phosphine ($PH_3$) concentration was 0.0006%, 0.0003%, 0.00015% or 0.00003%. However, no formation of diamond was observed.

Comparative Example 3

At a substrate temperature of 950° C., a phosphorus-doped diamond film having a thickness of 0.5 μm was synthesized on the (111) face of single crystal diamond under a pressure of 40 Torr under such a condition that to hydrogen ($H_2$), the methane ($CH_4$) concentration was 0.3%, and the phosphine ($PH_3$) concentration was 0.0006%. The resistivity of the obtained diamond film-was high at a level of $5 \times 10^7$ Ω·cm, whereby it was impossible to measure Hall effect.

Comparative Example 4

At a substrate temperature of 950° C., a phosphorus-doped diamond film having a thickness of 0.5 μm was synthesized on the (111) face of a single crystal diamond under a pressure of 550 Torr under such a condition that to hydrogen ($H_2$), the methane ($CH_4$) concentration was 0.2%, and the phosphine ($PH_3$) concentration was 0.0003%. The resistivity of the obtained diamond was high at a level of $7 \times 10^8$ Ω·cm, whereby it was impossible to measure the Hall effect.

Comparative Example 5

At a substrate temperature of 950° C., a phosphorus-doped diamond film having a thickness of 0.5 μm was synthesized on the (111) face of single crystal diamond under a pressure of 70 Torr under such a condition that to hydrogen ($H_2$), the methane ($CH_4$) concentration was 2%, and the phosphine ($PH_3$) concentration was 0.0006%. The resistivity of the obtained diamond film was high at a level of $3 \times 10^8$ Ω·cm, whereby it was impossible to measure the Hall effect.

Comparative Example 6

At a substrate temperature of 950° C., a synthesis of a phosphorus-doped diamond film was attempted on the (111) face of single crystal diamond under a pressure of 60 Torr under such a condition that to hydrogen ($H_2$), the methane ($CH_4$) concentration was 0.05%, and the phosphine ($PH_3$) concentration was 0.0005%. However, no satisfactory epitaxial film was obtained.

In this Example, the phosphine concentration is too high.

As described in detail in the foregoing, the present invention provides a diamond film having phosphorus doped into diamond without being bonded to hydrogen, which shows n-type characteristics.

What is claimed is:

1. A method of synthesizing phosphorus-doped diamond comprising subjecting a reaction gas of hydrogen, volatile hydrocarbon and a phosphorus source to a microwave plasma, under conditions of pressure, temperature, ratio of carbon in the volatile hydrocarbon to hydrogen in said reaction gas, and ratio of phosphorus to carbon in said reaction gas such that hydrogen bonded to phosphorus is disassociated and whereby phosphorus is introduced into diamond as an impurity without being bonded to hydrogen.

2. The method according to claim 1, wherein the ratio of carbon (C) in the volatile hydrocarbon to the hydrogen ($H_2$) mixed therewith is 1:100 or less, and the ratio of the phosphorus (P) to the carbon (C) in the reaction gas is 4:100 or less.

3. The method of claim 2 wherein the ratio of carbon (C) in the volatile hydrocarbon to the hydrogen ($H_2$) mixed therewith is 1:1000 to 5:1000, and the ratio of the phosphorus (P) to the carbon (C) in the reaction gas is from 4:100 to 4:10,000.

4. The method of claim 3, wherein the ratio of the phosphorus (P) to the carbon (C) in the reaction gas is from 3:100 to 1:1000.

5. The method according to claim 1, wherein a substrate for growing the diamond, is heated at a temperature of from 900 to 1100° C., so that hydrogen bonded to the phosphorus is dissociated, and the phosphorus freed from hydrogen is introduced into the diamond.

6. The method of claim 5, wherein the temperature is from 950 to 1000° C.

7. The method according to claim 1, wherein the pressure in a reaction chamber for the synthesis of the diamond is from 50 to 500 Torr.

8. The method of claim 7, wherein the pressure is from 80 to 150 Torr.

9. The method according to claim 1, wherein ultraviolet rays are irradiated to a substrate for growing the diamond, so that hydrogen bonded to the phosphorus is dissociated, and the phosphorus freed from hydrogen is introduced into the diamond.

\* \* \* \* \*